(12) United States Patent
Hsieh

(10) Patent No.: US 6,955,212 B1
(45) Date of Patent: Oct. 18, 2005

(54) WATER-COOLER RADIATOR MODULE

(75) Inventor: Hsin Mao Hsieh, Ping Tung (TW)

(73) Assignee: ADDA Corporation, Ping Tung (TW)

( * ) Notice: Subject to any disclaimer, the term of this patent is extended or adjusted under 35 U.S.C. 154(b) by 0 days.

(21) Appl. No.: 10/827,232

(22) Filed: Apr. 20, 2004

(51) Int. Cl.[7] .............................................. F28F 7/00
(52) U.S. Cl. ..................... 165/80.4; 361/697; 361/698
(58) Field of Search ................. 165/80.4, 121, 165/122, 80.1, 80.2, 80.3, 67, 76–78; 361/687–692, 361/695–697, 714–716, 724–725, 698, 699, 361/701–703; 257/714

(56) References Cited

U.S. PATENT DOCUMENTS

| | | | | |
|---|---|---|---|---|
| 5,323,847 A | * | 6/1994 | Koizumi et al. | 165/104.33 |
| 5,871,396 A | * | 2/1999 | Shen | 454/184 |
| 6,084,774 A | * | 7/2000 | Talbot et al. | 361/704 |
| 6,362,958 B1 | * | 3/2002 | Yu et al. | 361/687 |
| 6,754,077 B2 | * | 6/2004 | Lo et al. | 361/700 |
| 6,763,880 B1 | * | 7/2004 | Shih | 165/80.4 |
| 2003/0169566 A1 | * | 9/2003 | Owens et al. | 361/688 |

* cited by examiner

*Primary Examiner*—Tho Duong
(74) *Attorney, Agent, or Firm*—Bacon & Thomas, PLLC

(57) ABSTRACT

A water-cool radiator module comes with a supporting part having a shell body; the shell body includes a fan and a water tank; the water tank is connected to a cold water pipe and a hot water pipe; an extended section of the cold water pipe and hot water pipe is connected to a cold waterhead; the shell body includes several radiating holes at one end; such that in an application, the supporting part is inserted into a slot on the computer case and the shell body is mounted onto the slot; the cold water in the cold waterhead of a heat-generating electronic component is circulated to the shell body through the hot water pipe; the fan blows air to radiate heat to the outside through the radiating holes; and the cooled fluid flows from the water tank to the cold waterhead through the cold water pipe.

3 Claims, 5 Drawing Sheets

WATER-COOLER RADIATOR MODULE

BACKGROUND OF THE INVENTION

I. Field of the Invention

The present invention relates generally to a radiator module and, more specifically, a water-cool radiator module that is separated from a heavy water tank, a cold water pipe and a hot water pipe that are independently fixed in a slot for the purpose of reducing the load on the heat-generating electronic components and not occupying too much of the space of the electronic components.

II. Description of the Prior Art

Heretofore, it is known that a conventional radiator, as shown in FIG. 1, generally comprises a flat pedestal 10 that comprises a plurality of radiating fins 11 and a water conduit (not shown in FIG. 1) on the other side; the water conduit comprises a water inlet 12 and a water outlet 13; the pedestal 10 further comprises a fan 30. In practical use, this configuration has the following disadvantages:

1. In addition to radiating fins 11, some water conduit accessories are also located under the radiating fins 11. Such mechanism not only increases the height of the radiator structures but also increases the load of heat-generating electronic components due to the increased weight of water in the water conduit. As a result, this may cause damage to such electronic components and occupy more space.

2. Water in the water conduit stays and exchanges heat between the radiating fins 11. Therefore, heat stays on the radiating fins 11 resulting in a very slow radiating speed.

3. Fan 30 is located on the radiating fins 11. When fan 30 is turned on, heat current will flow slowly through a computer and then flow outward through the radiating holes on the computer. As a result, the heat may remain in the computer.

SUMMARY OF THE INVENTION

It is therefore a primary object of the present invention to provide a water-cool radiator module that comprises a supporting part having a shell body; the shell body comprises a fan and a water tank; the water tank is connected to a cold water pipe and a hot water pipe; an extended section of the cold water pipe and hot water pipe is connected to a cold waterhead; the shell body further comprises several radiating holes at one end; in practical application, the supporting part is fixed into a slot on the computer case and the shell body is mounted onto the slot; cold water on a heat-generating electronic component is circulated to the shell body via the hot water pipe; the fan heat blows air to radiate the heat to the outside via the radiating holes; and the cooled fluid flows from the water tank to the cold waterhead via the cold water pipe. With repeated circulation, the heat produced by the electronic component is taken away quickly. On the other hand, since the water tank, the radiating fins and the fan are all fixed into the slot, the heat-generating electronic component does not bear the weight of the water tank, the radiating fins and the fan. As a result, this reduces the possibility of any damage to the heat-generating electronic component and saves space above the heat-generating electronic component.

It is still an object for the invention to provide a water-cool radiator module in which a pump is installed inside the shell body to speed up the flow of hot water in the hot water pipe and control the flow direction.

It is still another object for the invention to provide a water-cool radiator module in which a fixing part is installed near the radiating holes of the supporting part, several holes are on the fixing part; in practical application, the supporting part is inserted into the slot, the fixing part is fixed firmly on the computer case to secure the shell body to the slot without swaying.

BRIEF DESCRIPTION OF THE DRAWINGS

The accomplishment of the above-mentioned object of the present invention will become apparent from the following description and its accompanying drawings which disclose illustrative an embodiment of the present invention, and are as follows.

DESCRIPTION OF THE PREFERRED EMBODIMENT

Figure 1:
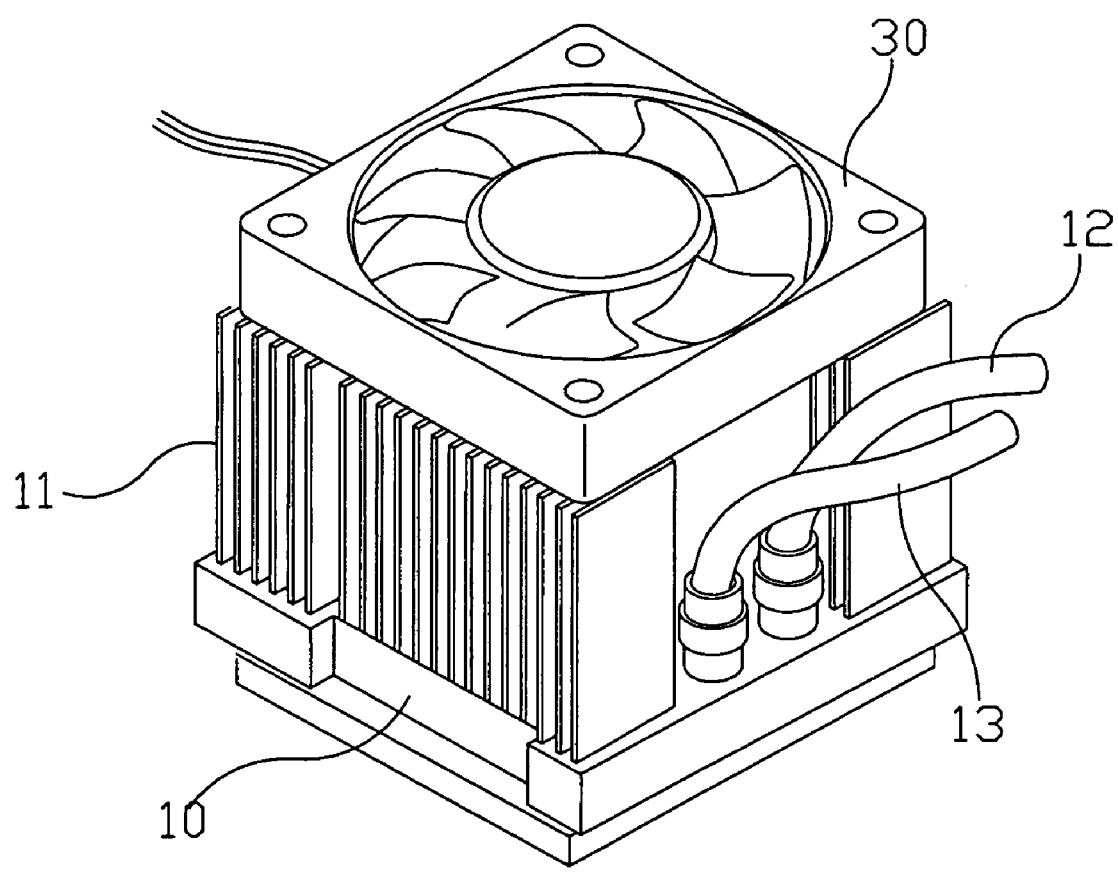
FIG. 1 is a perspective view of the prior art.
Figure 2:
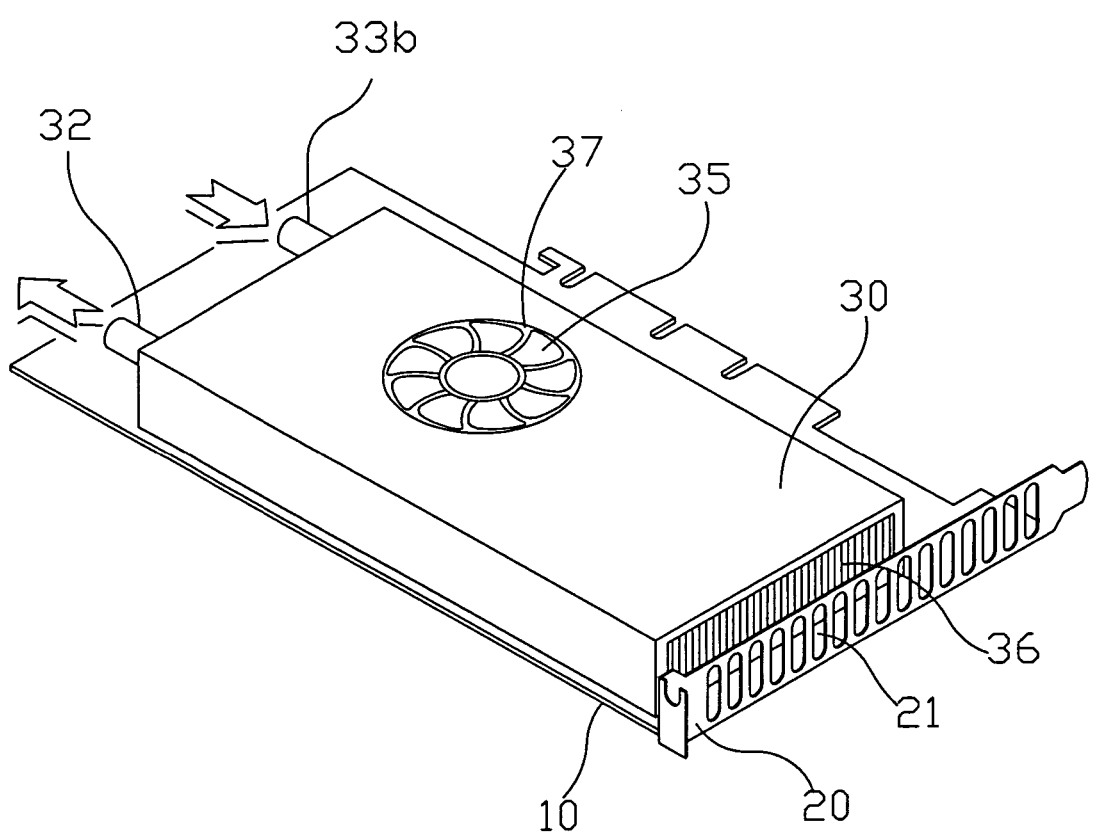
FIG. 2 is a perspective view of the present invention.

FIG. 2 shows a water-cool radiator module in accordance with a preferred embodiment of the present invention, wherein the module comprises a supporting part 10, the supporting part 10 may be coupled with the interfaces of various types of expansion slots such as AGP, PCI and ISA on one side and the supporting part 10 is inserted into the expansion slot, the supporting part 10 having a fixing part 20 on the other side; the fixing part 20 is perpendicular to supporting part 10 and comprises holes 21.

Figure 3:
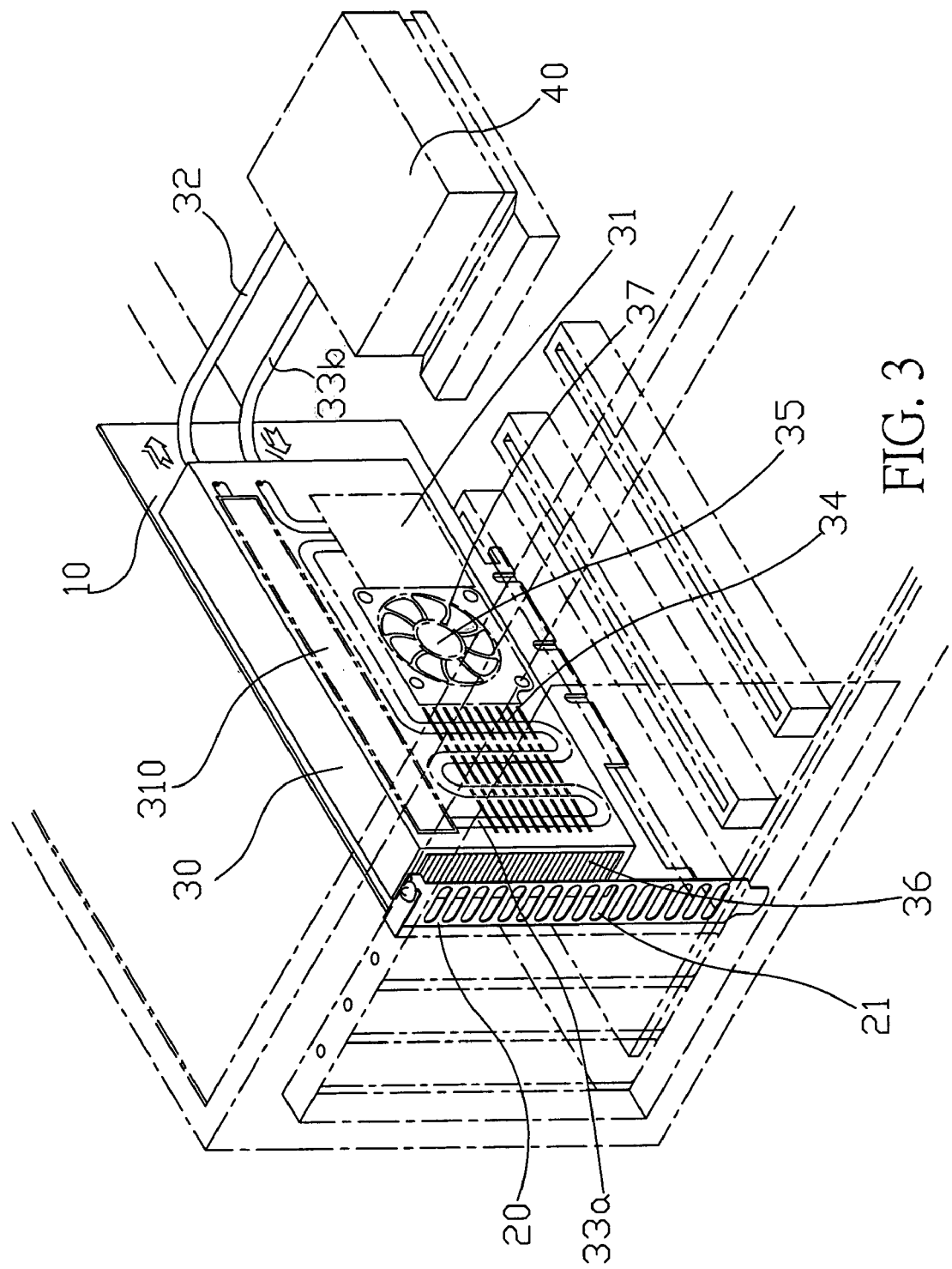
FIG. 3 is an assembly view of the present invention.

As shown in FIG. 3, the supporting part 10 comprises a shell body 30; the shell body 30 comprises a water tank 310 connected to a cold water pipe 32 and the other side of the water tank 310 is connected to a first hot water pipe 33a, and an extended part of the first hot water pipe 33a is in a continuous bending shape; several radiating fins 34 are aligned orderly on the bending section of the first hot water pipe 33a; a fan 35 is located adjacent to the radiating fins 34; an opening 37 is located at a region where the shell body 30 is not braced against the supporting part 10; the opening 37 faces a blowing opening of the fan 35; a pump 31 is located beside the fan 35 and connected to the first hot water pipe 33a and a second hot water pipe 33b; the first hot water pipe 33a extends outward from the pump 31 and connects to a cold waterhead 40; the cold waterhead 40 is also connected to the cold water pipe 32; several radiating holes 36 are located on the side where the shell body 30 faces the holes 21.

Figure 5:
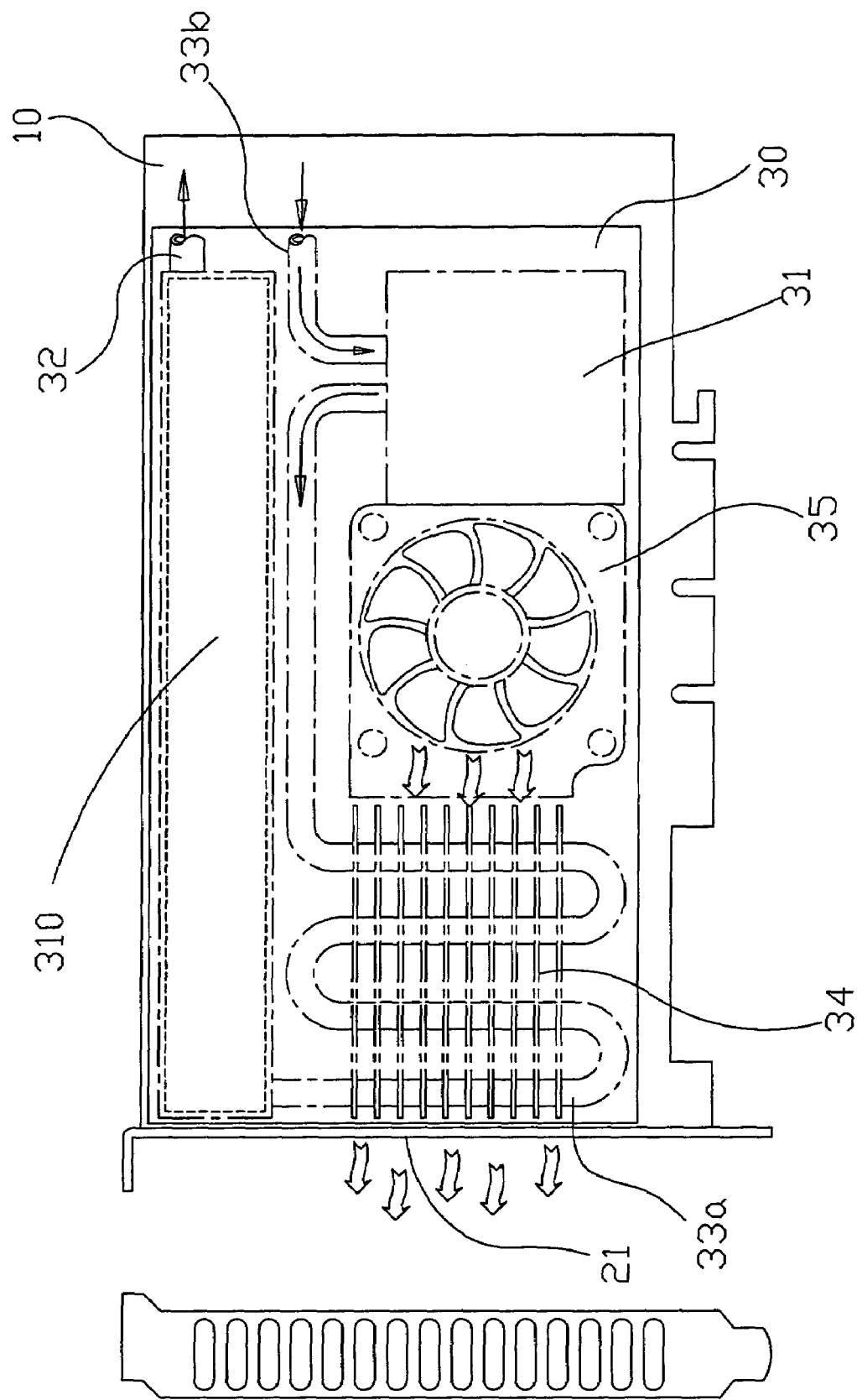
FIG. 5 is an application view of the present invention.

In practical use, as shown in FIGS. 2, 3 and 5, users install the cold waterhead 40 on the heat-generating electronic components (a processor in this application), and insert the cold waterhead 40 into the slot on the computer case via the supporting part 10; the supporting part 10 is fixed in a slot on the computer case by the fixing of the fixing part 20 on the back of computer case, the shell body 30 is firmly fixed into the slot; such that the heat conducted from an electronic component to the cold waterhead 40 will raise the temperature of the fluid in the cold waterhead 40. By the driving of the pump 31, hot water flows back to the pump 31 via the second hot water pipe 33b and out of the pump 31 via the first hot water pipe 33a and then flows through the radiating fins 34; the fan 35 draws cold air into the shell body 30 to cool the water flowing through the radiating fins 34; after the heat in the water is quickly radiated through the radiating holes 36 and the holes 21, cool water flows from water tank 310 to the cold waterhead 40 via the cold water pipe 32.

With repeated circulation, the heat produced by the electronic component is taken away quickly. On the other hand, since the cold waterhead 40 is separated from the water tank 310, the radiating fins 34 and the fan 35, and the water tank 310, the radiating fins 34 and the fan 35 are all fixed into the slot, the heat-generating electronic component does not bear the weight of the water tank 310, the radiating fins 34 and the fan 35. As a result, such arrangement reduces the possibility of any damage to the heat-generating electronic component and saves space above the heat-generating electronic component.

Figure 4:
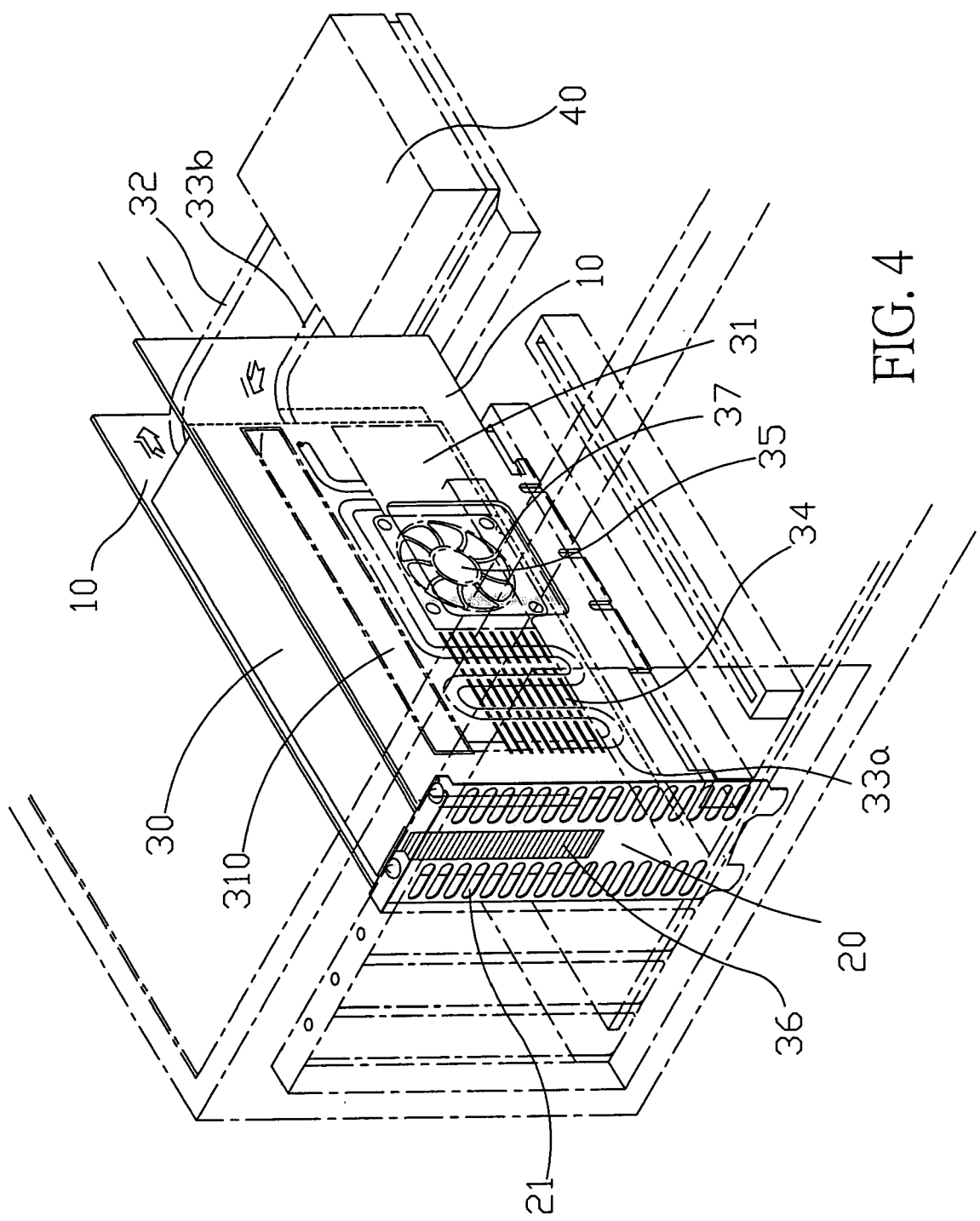
FIG. 4 is another assembly view of the present invention.

FIG. 4 shows another application of the present invention wherein the radiator module comprises a shell body 30; a supporting part 10 attached on both sides of the shell body 30; and the supporting part 10 inserted into two slots; one side of the supporting part 10 comprises a fixing part 20 that is connected to the supporting part 10; the fixing part 20 is perpendicular to the supporting part 10 and comprises holes 21; the supporting part 10 further comprises a shell body 30; the shell body 30 comprises a water tank 310 connected to a cold water pipe 32 and a first hot water pipe 33a; the first hot water pipe 33a is in a continuous bending shape and extends outward via water tank 310, several radiating fins 34 are aligned orderly on the bending section of the hot water pipe 33; a fan 35 is located beside the radiating fins 34; an opening 37 is located at a region where the shell body 30 is not braced against the supporting part 10; the opening 37 faces the fan 35; a pump 31 is located beside the fan 35 and connected to the first hot water pipe 33a and a second hot water pipe; the second hot water pipe 33a extends outward via pump 31 and connects to a cold waterhead 40; the cold waterhead 40 is also connected to the cold water pipe 32; several radiating holes 36 are located on the side where the shell body 30 faces the holes 21.

In practical use, as shown in FIGS. 3, 4 and 5, users install the cold waterhead 40 on the heat-generating electronic component (a processor in this application), and insert the cold waterhead 40 into the slot on the computer case via the supporting part 10, the supporting part 10 is fixed in a slot on the computer case by the fixing of the fixing part 20 on the back of computer case, the shell body 30 is firmly fixed on the slot; such that the heat conducted from electronic component to cold waterhead 40 will raise the temperature of the water in the cold waterhead 40. By the driving of the pump 31, hot water flows back to the pump 31 via the second hot water pipe 33b and out of the pump 31 via the first hot water pipe 33a and then flows through the radiating fins 34; the fan 35 draws cold air into the shell body 30 to cool water flowing through the radiating fins 34; after the heat in the water is quickly radiated through the radiating holes 36 and the holes 21, cool water flows from the water tank 310 to the cold waterhead 40 via the cold water pipe 32. With repeated circulations, the heat produced by the electronic component is taken away quickly. On the other hand, since the cold waterhead 40 is separated from the water tank 310, the radiating fins 34 and the fan 35, and the water tank 310, the radiating fins 34 and the fan 35 are all fixed on slot, the heat-generating electronic component does not bear the weight of the water tank 310, the radiating fins 34 and the fan 35. As a result, this reduces the possibility of any damage to the heat-generating electronic component and saves space above the heat-generating electronic component.

While a preferred embodiment of the invention has been shown and described in detail, it will be readily understood and appreciated that numerous omissions, changes and additions may be made without departing from the spirit and scope of the invention.

What is claimed is:

1. A water-cool radiator module, comprising:
   a shell body, having an opening disposed on a surface of said shell body, and a radiating hole disposed on one side of said shell body;
   a pump, installed inside said shell body and having a first hot water pipe and a second hot water pipe, and said first hot water pipe is in a continuous bending shape and connected to said pump and having an end interconnected with a water tank, and said first hot water pipe has a plurality of radiating fins aligned orderly on the bending section of said first hot water pipe, and the other end of said second hot water pipe is connected to a cold waterhead;
   the water tank, being installed inside said shell body and connected to a cold water pipe and said first hot water pipe;
   a fan, installed between said radiating fins and said pump and an opening of said fan faces said shell body;
   the cold waterhead, connected to one side of said cold and second hot water pipes that is extended outside of said shell body;
   a supporting part, installing said pump, the water tank, and said fan and being attached on said shell body, and one end of said supporting part is inserted into a slot in a computer; and
   a fixing part, installed on another end of said supporting part for fixing said supporting part onto the backside of said computer case, and having an opening disposed on said fixing part at a position corresponding to said radiating holes;
   characterized in that: with the foregoing components, said water-cool radiator module can be fixed by said supporting member being inserted in said slot of said computer, and separate a heat-generating electronic component from said water tank, said radiating fins and said fan on said slot, such that said heat-generating electronic component needs not stand the weight of said water tank, radiating fins and fan and thus reducing the possibility of damaging said electronic component and reducing the space occupied by said heat-generating electronic component.

2. The water-cool radiator module recited in claim 1, wherein said supporting part is attached on both sides of said shell body.

3. The water-cool radiator module recited in claim 1, wherein said fixing part is connected to more than one supporting parts.

* * * * *